US011348797B2

(12) United States Patent
Harada et al.

(10) Patent No.: US 11,348,797 B2
(45) Date of Patent: May 31, 2022

(54) STACKED WAFER PROCESSING METHOD

(71) Applicant: DISCO CORPORATION, Tokyo (JP)

(72) Inventors: Shigenori Harada, Tokyo (JP); Yoshiaki Yodo, Tokyo (JP); Koji Watanabe, Tokyo (JP); Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 104 days.

(21) Appl. No.: 16/856,226

(22) Filed: Apr. 23, 2020

(65) Prior Publication Data

US 2020/0343095 A1 Oct. 29, 2020

(30) Foreign Application Priority Data

Apr. 25, 2019 (JP) .............................. JP2019-084027

(51) Int. Cl.
| | |
|---|---|
| *H01L 21/02* | (2006.01) |
| *H01L 21/304* | (2006.01) |
| *H01L 21/67* | (2006.01) |
| *B23K 26/36* | (2014.01) |
| *H01L 21/18* | (2006.01) |
| *B24B 7/22* | (2006.01) |
| *H01L 21/683* | (2006.01) |

(52) U.S. Cl.
CPC ............ *H01L 21/304* (2013.01); *B23K 26/36* (2013.01); *B24B 7/228* (2013.01); *H01L 21/02021* (2013.01); *H01L 21/187* (2013.01); *H01L 21/67092* (2013.01); *H01L 21/6835* (2013.01); *H01L 2221/6834* (2013.01)

(58) Field of Classification Search
CPC ........... H01L 21/02002; H01L 21/2007; H01L 21/2011; H01L 21/304; H01L 21/67092; H01L 21/02021; H01L 21/6835; H01L 21/187; H01L 21/76251; H01L 33/0093; B23K 26/36; B24B 7/228
See application file for complete search history.

(56) References Cited

U.S. PATENT DOCUMENTS

2021/0202316 A1* 7/2021 Upadhyayula ........ H01L 21/304

FOREIGN PATENT DOCUMENTS

| DE | 102018200656 A1 * | 7/2019 | ....... H01L 21/02013 |
|---|---|---|---|
| JP | 2000173961 A | 6/2000 | |

* cited by examiner

*Primary Examiner* — Eduardo A Rodela
(74) *Attorney, Agent, or Firm* — Greer, Burns & Crain, Ltd.

(57) ABSTRACT

A stacked wafer processing method for processing one wafer of a stacked wafer having at least two layers laminated, includes a sheet laying step of laying a thermocompression bonding sheet on an upper face of the one wafer, a thermocompression bonding step of thermocompression-bonding the thermocompression bonding sheet to an outer peripheral portion of the one wafer where a chamfered portion is formed, a modified layer forming step of irradiating the stacked wafer with a laser beam having a transmission wavelength to the thermocompression bonding sheet and the one wafer from the thermocompression bonding sheet side with a focal point of the laser beam positioned inside the outer peripheral portion of the one wafer, thereby continuously forming a modified layer inside the one wafer, and a chamfered portion removing step of expanding the thermocompression bonding sheet to break the chamfered portion, thereby removing the chamfered portion from the one wafer.

8 Claims, 6 Drawing Sheets

STACKED WAFER PROCESSING METHOD

BACKGROUND OF THE INVENTION

Field of the Invention

The present invention relates to a stacked wafer processing method for processing one wafer of a stacked wafer having at least two layers laminated.

Description of the Related Art

A plurality of devices such as integrated circuits (ICs) and large-scale integrated circuits (LSIs) are formed on a front face of a wafer individually in a plurality of separate regions defined by a plurality of crossing division lines. The wafer thus having the plurality of devices formed thereon has a back face ground to be a desired thickness and then divided along the division lines into individual device chips by a dicing apparatus. The resulting device chips are used in various kinds of electrical equipment such as mobile phones and personal computers.

The wafer has a chamfered portion formed at an end portion of an outer periphery thereof. Therefore, there is a problem that, when the back face of the wafer is ground to be half the initial thickness or thinner, part of the chamfered portion left unground becomes a sharp edge like a knife at the outer periphery, and a crack may be generated from the knife-like edge, resulting in breakage of the wafer. To cope with this problem, there is proposed a technology for removing a region where a chamfered portion is formed at an outer periphery of a wafer by use of a cutting blade (see Japanese Patent Laid-open No. 2000-173961, for example).

SUMMARY OF THE INVENTION

In a case where the region having the chamfered portion is to be removed by use of a cutting blade from a wafer formed of a single material, the above-described technology disclosed in Japanese Patent Laid-open No. 2000-173961 enables removal of the chamfered portion in a favorable manner. In the case of a stacked wafer in which a plurality of wafers are laminated one on top of the other, however, since there may be a slight gap left between the laminated wafers, this technology still has a problem that minute vibrations at the time of cutting an outer peripheral portion by use of a cutting blade can cause a damage such as a crack to an outer periphery of the wafers constituting the stacked wafer.

It is therefore an object of the present invention to provide a stacked wafer processing method which can remove a chamfered portion in an outer peripheral portion of one wafer of a stacked wafer having at least two layers laminated in an appropriate manner.

In accordance with an aspect of the present invention, there is provided a stacked wafer processing method for processing one wafer of a stacked wafer having at least two layers laminated. The stacked wafer processing method includes a sheet laying step of laying a thermocompression bonding sheet on an upper face of the one wafer, a thermocompression bonding step of thermocompression-bonding the thermocompression bonding sheet to an outer peripheral portion of the one wafer where a chamfered portion is formed, a modified layer forming step of irradiating the stacked wafer with a laser beam having a transmission wavelength to the thermocompression bonding sheet and the one wafer from the thermocompression bonding sheet side with a focal point of the laser beam positioned inside the outer peripheral portion of the one wafer, thereby continuously forming a modified layer inside the one wafer, and a chamfered portion removing step of expanding, after performing the modified layer forming step, the thermocompression bonding sheet to break the chamfered portion, thereby removing the chamfered portion from the one wafer.

Preferably, the stacked wafer processing method further includes a grinding step of grinding, after performing the chamfered portion removing step, the upper face of the one wafer to a desired thickness. Preferably, the thermocompression bonding sheet includes a polyolefin sheet or a polyester sheet. Preferably, in a case where the thermocompression bonding sheet is a polyolefin sheet, the polyolefin sheet includes a polyethylene sheet, a polypropylene sheet, or a polystyrene sheet and, in a case where the thermocompression bonding sheet is a polyester sheet, the polyester sheet includes a polyethylene terephthalate sheet or a polyethylene naphthalate sheet.

According to the present invention, a chamfered portion of one wafer of a stacked wafer can be removed in an appropriate manner without causing a crack at an outer periphery of the one wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
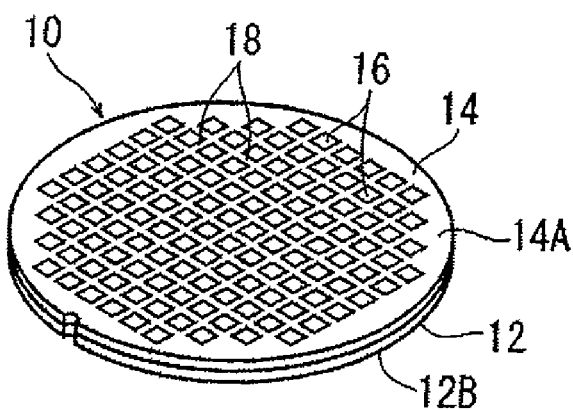
FIG. 1A is a perspective view illustrating a front face side of an exemplary stacked wafer to be processed by a stacked wafer processing method according to an embodiment of the present invention.
Figure 1B:
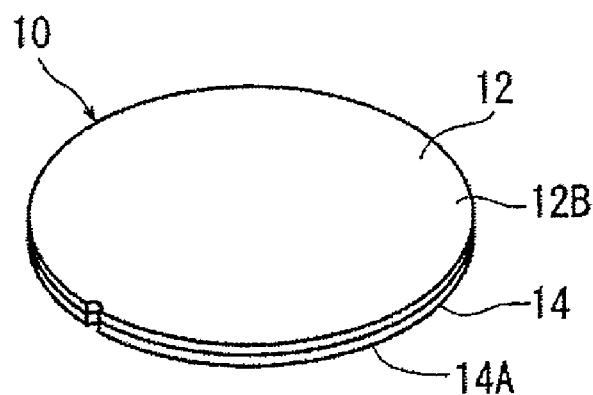
FIG. 1B is a perspective view illustrating a back face side of the stacked wafer.
Figure 1C:
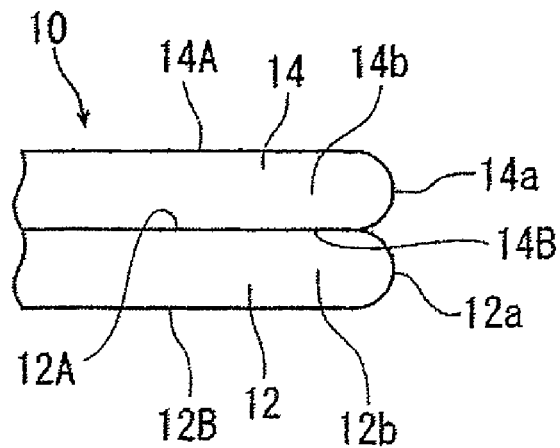
FIG. 1C is a partially enlarged sectional view of the stacked wafer.

A stacked wafer processing method according to an embodiment of the present invention will now be described in detail with reference to the attached drawings. FIGS. 1A to 1C illustrate a stacked wafer 10 to be processed by the stacked wafer processing method according to the present embodiment. The stacked wafer 10, for example, includes a first wafer 12 as one wafer and a second wafer 14 as another wafer laminated with each other. The first wafer 12 is, for example, a mother wafer formed of silicon (Si) and has a front face 12A and a back face 12B. The second wafer 14 is a wafer formed of a silicon substrate and has a front face 14A and a back face 14B. A plurality of crossing division lines 18 are formed on the front face 14A to thereby define a plurality of separate regions where a plurality of devices 16 are individually formed. The back face 14B of the second wafer 14 is laminated on and bonded to the front face 12A of the first wafer 12 with an adhesive layer interposed therebetween, thereby forming the stacked wafer 10. Note that the material forming the stacked wafer 10 to be processed by the processing method of the present invention is not limited to the material described above, and the stacked wafer 10 may be a generally known wafer such as a sapphire substrate, a glass substrate, and a lithium niobate (LN) substrate. Further, the stacked wafer 10 is not limited to a stacked wafer formed by combining wafers of a same material and may be formed by combining wafers of different materials.

FIG. 1C illustrates a partially enlarged sectional view of the stacked wafer 10. As illustrated in FIG. 1C, the first wafer 12 has, at a side end of an outer peripheral portion 12b thereof, a chamfered portion 12a formed to be chamfered in a round shape. Similarly, the second wafer 14 has, at a side end of an outer peripheral portion 14b thereof, a chamfered portion 14a formed to be chamfered in a round shape.

After the above-described stacked wafer 10 is prepared, a sheet laying step is performed in the following manner. The stacked wafer 10 is turned upside down as illustrated in FIG. 1B, so that the back face 12B of the first wafer 12 which is one wafer to be processed faces upward to be an upper face. A thermocompression bonding sheet is then laid on the upper face (back face 12B) of the first wafer 12.

Figure 2A:
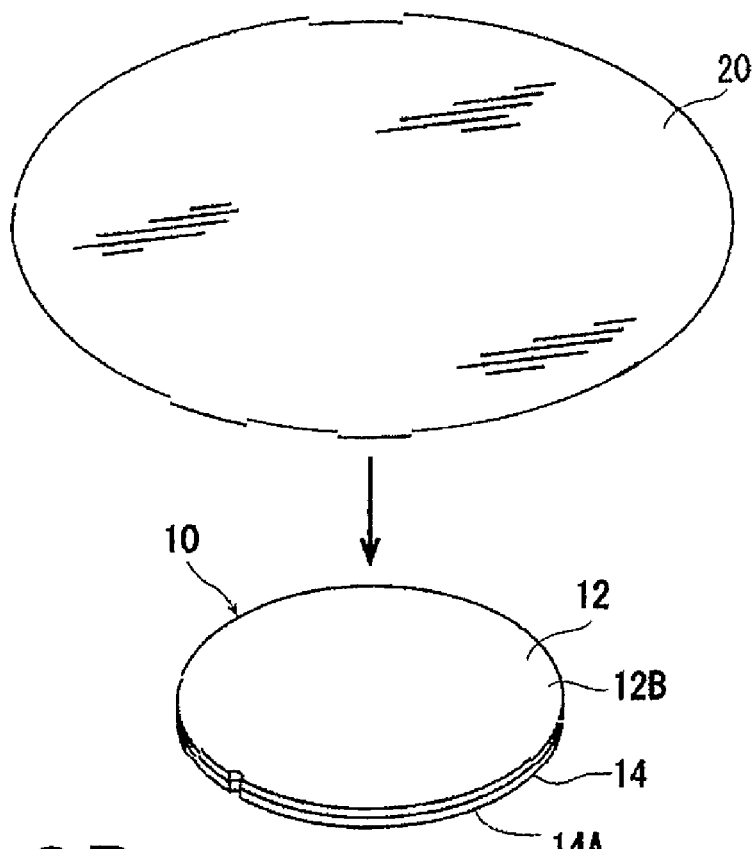
FIGS. 2A and 2B are perspective views illustrating a sheet laying step according to the embodiment.
Figure 2B:
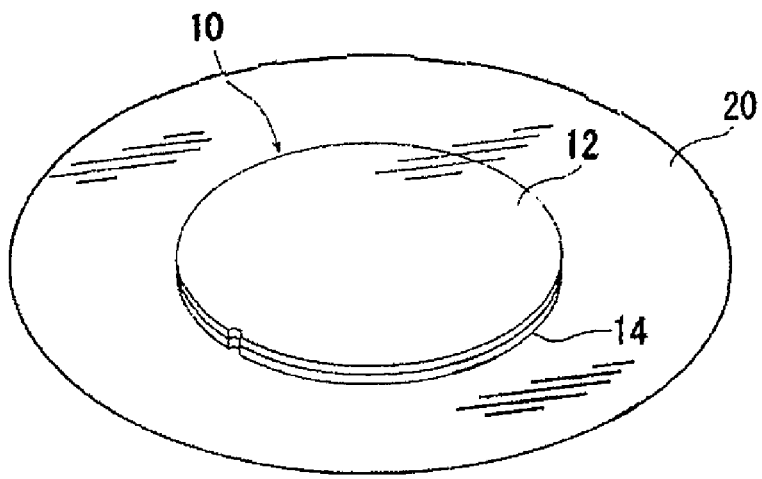

Before performing the sheet laying step, a thermocompression bonding sheet 20 which is formed larger in size than the stacked wafer 10 is prepared as illustrated in FIG. 2A. The thermocompression bonding sheet 20 is elastic, exhibits adhesiveness when heated up to a melting temperature of a material constituting the thermocompression bonding sheet 20, and remains adhesive even when the temperature drops after the heating. The thermocompression bonding sheet 20 having such characteristics includes a polyolefin sheet or a polyester sheet. When a polyolefin sheet is adopted as the thermocompression bonding sheet 20, a sheet formed of a polyethylene sheet, a polypropylene sheet, or a polystyrene sheet can be selected, for example. When a polyester sheet is adopted as the thermocompression bonding sheet 20, a sheet formed of a polyethylene terephthalate sheet or a polyethylene naphthalate sheet can be selected. Note that a polyethylene sheet is selected as the thermocompression bonding sheet 20 in the present embodiment.

After the above-described thermocompression bonding sheet 20 is prepared, the stacked wafer 10 is held on a rotatable table not illustrated, and the thermocompression bonding sheet 20 is laid on the upper face of the first wafer 12 as illustrated in FIG. 2A (sheet laying step).

After the sheet laying step is performed, a thermocompression bonding step is performed in which the thermocompression bonding sheet 20 is thermocompression-bonded to the outer peripheral portion 12b of the first wafer 12 where the chamfered portion 12a is formed. The thermocompression bonding step is described below with reference to FIGS. 3A and 3B.

Figure 3A:
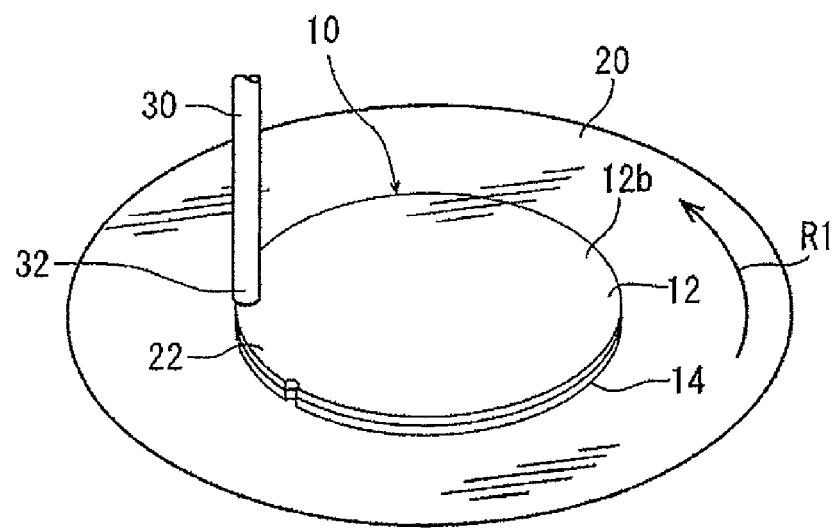
FIG. 3A is a perspective view illustrating a thermocompression bonding step according to the embodiment.
Figure 3B:
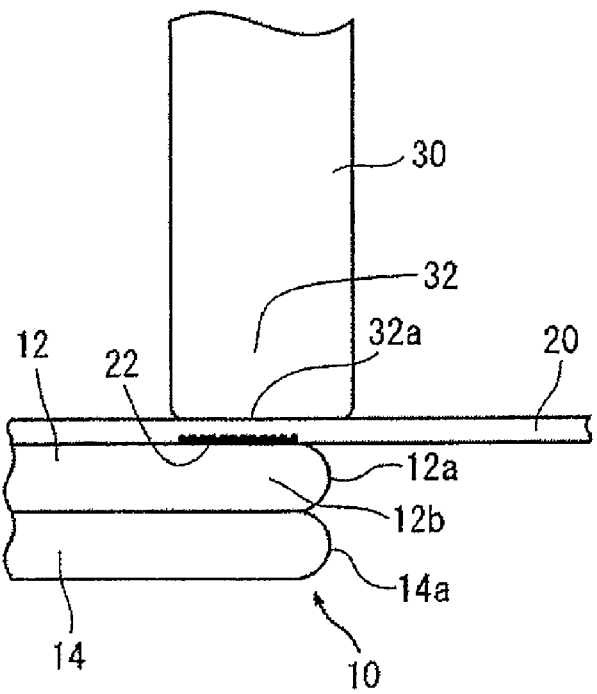
FIG. 3B is a partially enlarged sectional view in the thermocompression bonding step.

In the thermocompression bonding step, a heating rod 30 is prepared, for example, as illustrated in FIGS. 3A and 3B. The heating rod 30 is formed of a ceramic material and incorporates an electric heater and a temperature sensor, which are not illustrated, such that a lower end portion 32 of the heating rod 30 is controlled to be at a desired temperature by turning on the electric heater. The lower end portion 32 of the heating rod 30 has a lower face 32a formed to be flat, and it is preferable that the flat lower face 32a is coated with a fluororesin in order to be slippery on the thermocompression bonding sheet 20.

In the thermocompression bonding step, the lower end portion 32 of the heating rod 30 is positioned above the outer peripheral portion 12b of the first wafer 12 of the stacked wafer 10 where the chamfered portion 12a is formed. After the heating rod 30 is positioned above the outer peripheral portion 12b, the heating rod 30 is lowered such that the lower face 32a is pressed against the thermocompression bonding sheet 20 at a predetermined pressure as illustrated in FIG. 3B while at the same time the stacked wafer 10 is rotated at a predetermined speed in a direction indicated by an arrow R1 of FIG. 3A. The pressed portion of the thermocompression bonding sheet 20 is heated by the heating rod 30 to approximately 160° C. to 200° C., which reaches a melting temperature of the polyethylene sheet. The portion of the thermocompression bonding sheet 20 thus heated has a bonding face 22 to be bonded to the first wafer 12, and the bonding face 22 exhibits adhesiveness. As illustrated in FIG. 3B, the outer peripheral portion 12b of the first wafer 12, excluding a central region of the first wafer 12, and the thermocompression bonding sheet 20 are bonded to each other through the bonding face 22. Note that the central region corresponds to a region including a device region in which the devices 16 are formed on the front face 14A of the second wafer 14. In other words, the first wafer 12 and the thermocompression bonding sheet 20 are bonded to each other only in an outer region surrounding the device region formed on the second wafer 14 (thermocompression bonding step).

After the thermocompression bonding step is performed, a modified layer forming step is performed in which the stacked wafer is irradiated with a laser beam having a transmission wavelength to the thermocompression bonding sheet 20 and the first wafer 12 from the thermocompression bonding sheet 20 side with a focal point of the laser beam positioned inside the outer peripheral portion 12b of the first wafer 12, thereby continuously forming a modified layer inside the outer peripheral portion 12b. The modified layer forming step is described below with reference to FIGS. 4A and 4B.

Figure 4A:
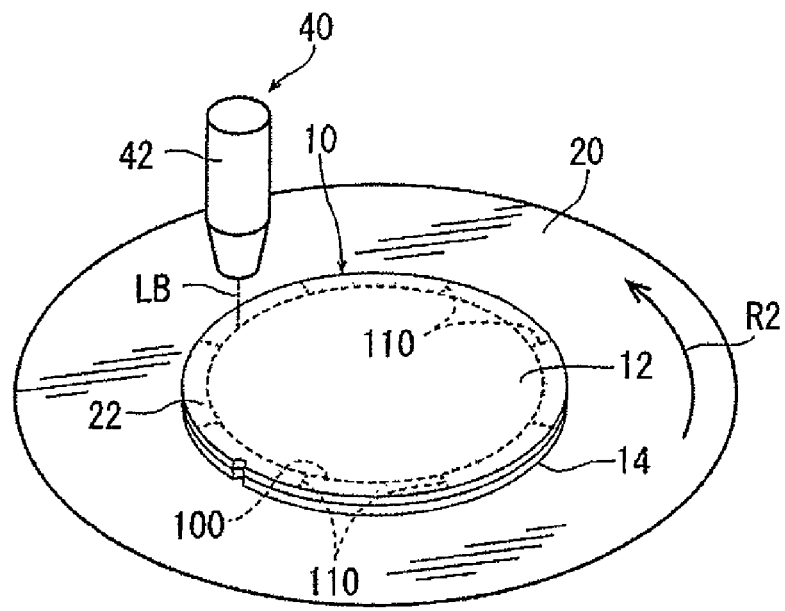
FIG. 4A is a perspective view illustrating a modified layer forming step according to the embodiment.
Figure 4B:
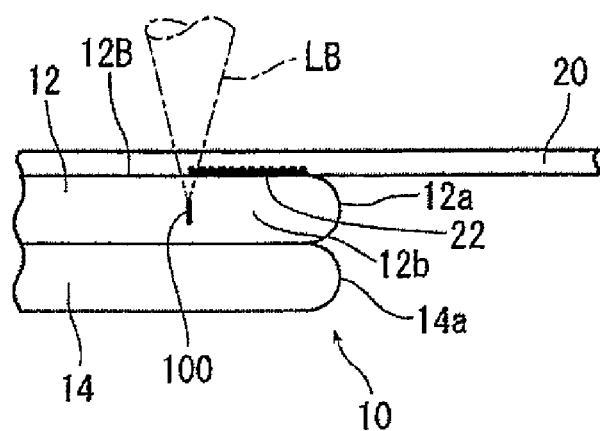
FIG. 4B is a partially enlarged sectional view in the modified layer forming step.

In performing the modified layer forming step, as illustrated in FIG. 4A, the stacked wafer 10 with the thermocompression bonding sheet 20 thermocompression-bonded is transferred to a laser processing apparatus 40 partly illustrated and held on a rotatable holding table not illustrated. The laser processing apparatus 40 includes a laser beam applying unit 42 that irradiates a pulsed laser beam having a transmission wavelength to the thermocompression bonding sheet 20 and the first wafer 12.

In a state in which the stacked wafer 10 is held on the holding table of the laser processing apparatus 40 with the second wafer 14 side of the stacked wafer 10 facing downward, the laser beam applying unit 42 is positioned above the outer peripheral portion 12b of the first wafer 12. A focal point of a laser beam LB is then positioned inside the outer peripheral portion 12b of the first wafer 12 through the thermocompression bonding sheet 20, and the laser beam LB is irradiated while at the same time the stacked wafer 10 is rotated in a direction indicated by an arrow R2 together with the holding table. A modified layer 100 is thereby formed continuously inside the outer peripheral portion 12b of the first wafer 12 as indicated by a dotted line in FIG. 4A. Note that, preferably, the modified layer 100 is formed along a region corresponding to an inner periphery of the bonding face 22 of the thermocompression bonding sheet 20 bonded to the first wafer 12 when viewed from above. Further, it is preferable that auxiliary modified layers 110 are formed inside the outer peripheral portion 12b of the first wafer 12 as indicated by radial dotted lines in FIG. 4A in order to circumferentially divide the outer peripheral portion 12b into small pieces, which is optional.

For example, the above-described modified layer forming step is performed under following laser processing conditions.

Wavelength: 1064 or 1342 nm
Average power: 0.5 to 2.0 W
Repetition frequency: 60 to 90 kHz
Processing-feed speed: 200 to 1000 mm/sec After the modified layer forming step is performed in the above-described manner, a chamfered portion removing step is performed in which the thermocompression bonding sheet 20 is expanded to break the chamfered portion 12a of the first wafer 12, thereby removing the chamfered portion 12a from the first wafer 12. The chamfered portion removing step is described below with reference to FIGS. 5 and 6.

Figure 5:
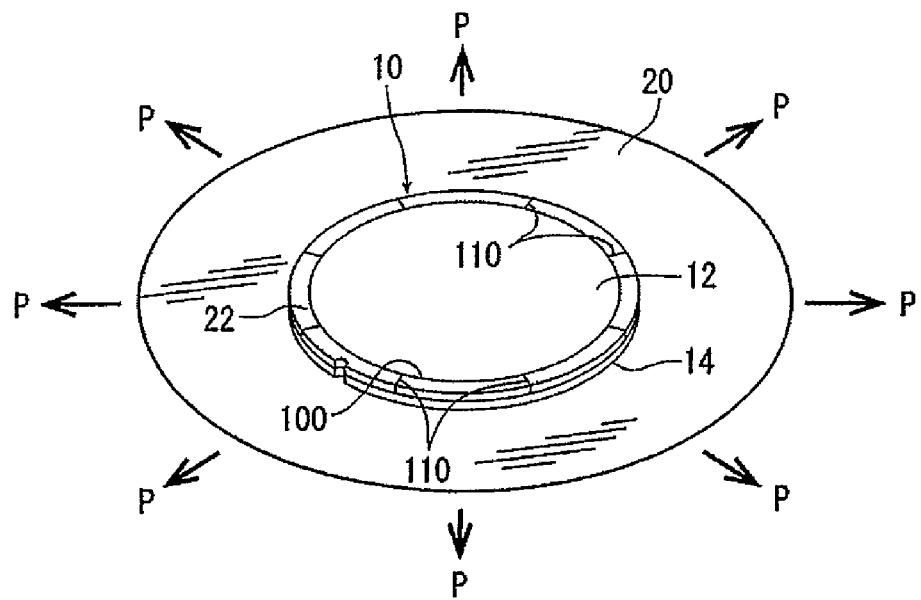
FIG. 5 is a perspective view illustrating a manner in which a thermocompression bonding sheet is expanded in a chamfered portion removing step according to the embodiment.

The thermocompression bonding sheet 20 is formed larger in size than the stacked wafer 10 as illustrated in FIG. 5, and a region of the thermocompression bonding sheet 20 on an outer side with respect to the bonding face 22 is expanded outward by a force P. Since the thermocompression bonding sheet 20 and the first wafer 12 are bonded to each other through the bonding face 22 of the thermocompression bonding sheet 20, when the thermocompression bonding sheet 20 is expanded in the above-described manner, the outer peripheral portion 12b of the first wafer 12 including the chamfered portion 12a is broken along the modified layer 100 and the auxiliary modified layers 110, thereby breaking the chamfered portion 12a.

Figure 6:
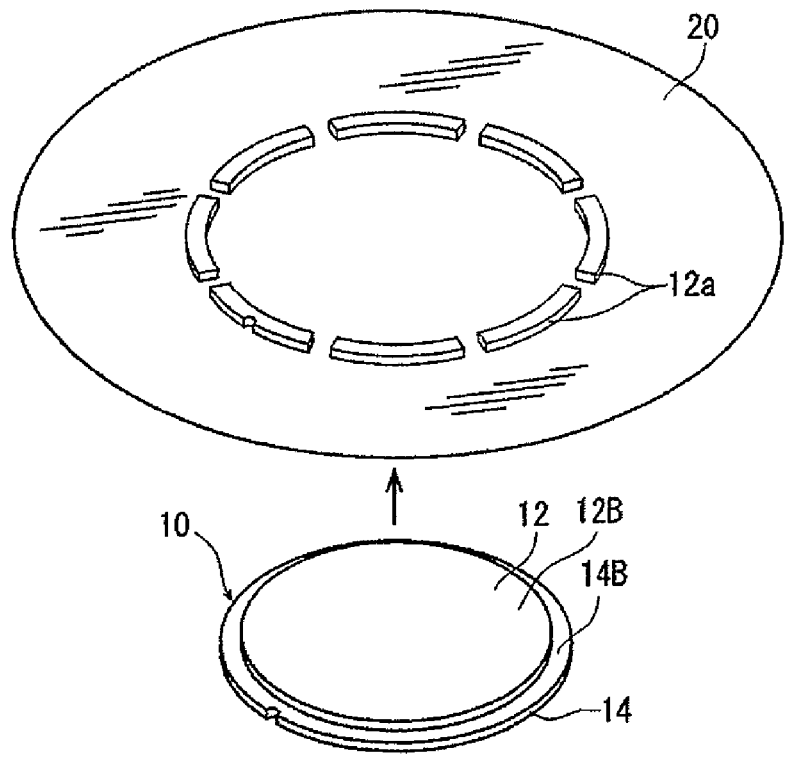
FIG. 6 is a perspective view illustrating a manner in which the thermocompression bonding sheet is separated from the stacked wafer in the chamfered portion removing step.

After the chamfered portion 12a of the first wafer 12 is broken along the modified layer 100 and the auxiliary modified layers 110, the thermocompression bonding sheet 20 is separated from the upper face (back face 12B) of the first wafer 12 as illustrated in FIG. 6. As stated above, the central region of the first wafer 12 and the thermocompression bonding sheet 20 are not bonded to each other, and only the outer peripheral portion 12b including the chamfered portion 12a is thermocompression-bonded to the thermocompression bonding sheet 20. Therefore, the chamfered portion 12a is removed from the first wafer 12 constituting the stacked wafer 10. With the chamfered portion 12a removed from the first wafer 12 constituting the stacked wafer 10 in this manner, an outer periphery of the back face 14B of the second wafer 14 is exposed upward when viewed from the first wafer 12 side (chamfered portion removing step).

The present embodiment includes, after performing the chamfered portion removing step, a grinding step in which the upper face (back face 12B) of the first wafer 12 is ground to be a desired thickness. In performing the grinding step, the stacked wafer 10 that has undergone the above-described chamfered portion removing step is transferred to a grinding apparatus 50 partly illustrated in FIGS. 7A and 7B. The grinding apparatus 50 includes a chuck table 52, a rotatable spindle 54 rotated by a rotational drive mechanism not illustrated, a mounter 56 attached to a lower end of the rotatable spindle 54, and grinding stones 58 annularly disposed on a lower face of a grinding wheel attached to the mounter 56.

Figure 7A:
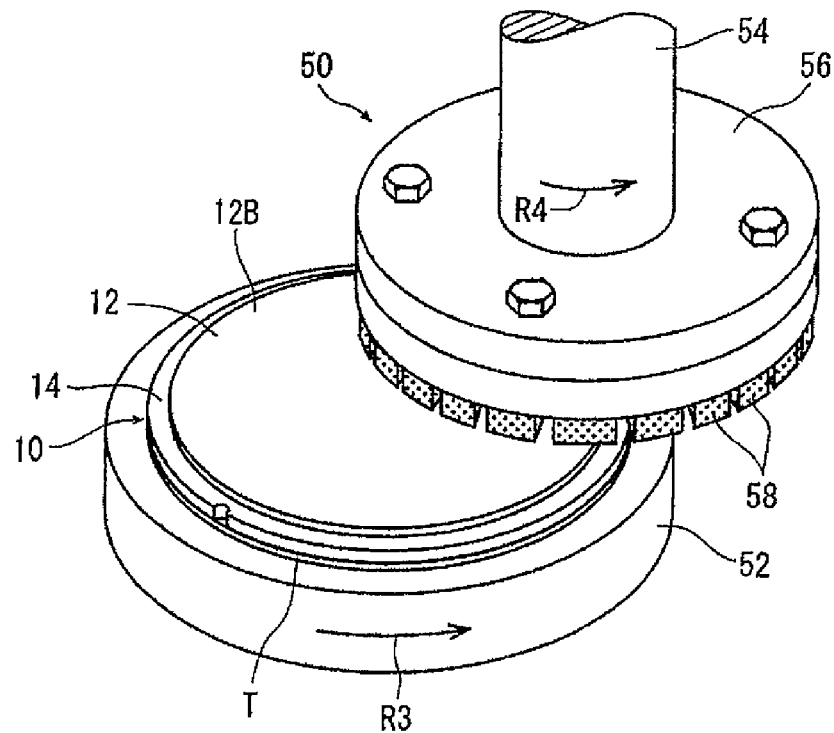
FIG. 7A is a perspective view illustrating a grinding step according to the embodiment.
Figure 7B:
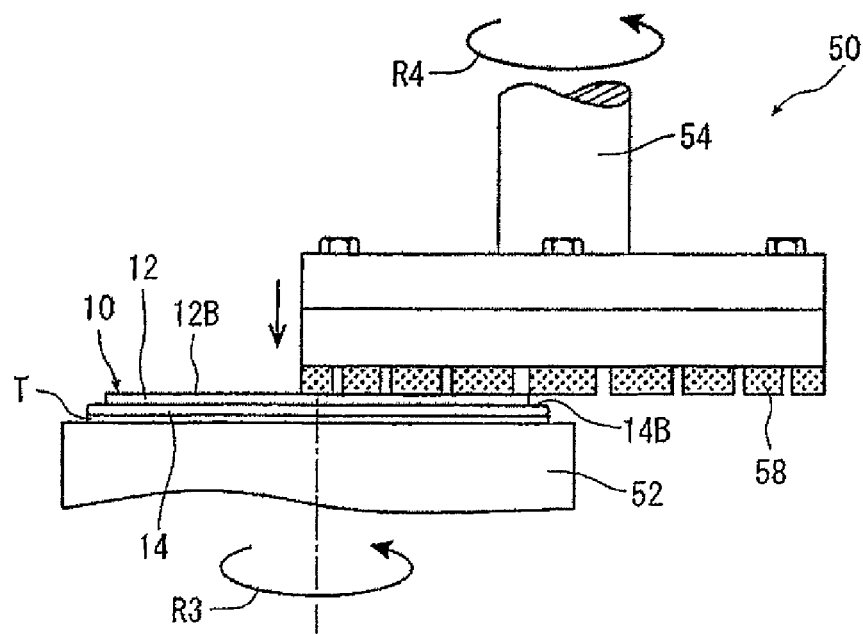
FIG. 7B is a partially enlarged side view in the grinding step.

After the stacked wafer 10 is transferred to the grinding apparatus 50, the stacked wafer 10 is placed on and held by the chuck table 52 with a protective tape T interposed therebetween such that the back face 12B side of the first wafer 12 faces upward and the second wafer 14 side faces downward as illustrated in FIGS. 7A and 7B. The chuck table 52 thus holding the stacked wafer 10 thereon is rotated in a direction indicated by an arrow R3 in the figures at a speed of 300 rpm, for example, while at the same time the rotatable spindle 54 is rotated in a direction indicated by an arrow R4 in the figures at a speed of 6000 rpm, for example. The grinding stones 58 are thereafter made in contact with the back face 12B of the first wafer 12 and grind-fed downward at a grind-feeding speed of 1 μm/sec, for example. In this case, the grinding can be performed while at the same time measuring the thickness of the first wafer 12 (or stacked wafer 10) with a contact type or non-contact type thickness measuring apparatus not illustrated. The back face 12B of the first wafer 12 is ground in this manner, and the grinding step is ended when the stacked wafer 10 is thinned to a desired thickness.

As stated above, in the present embodiment, the thermocompression bonding sheet 20 is thermocompression-bonded to the outer peripheral portion 12b of one wafer (first wafer 12) of the stacked wafer 10 where the chamfered portion 12a is formed, and the stacked wafer 10 is irradiated with a laser beam LB having a transmission wavelength to the thermocompression bonding sheet 20 and the first wafer 12 from the thermocompression bonding sheet 20 side with the focal point of the laser beam LB positioned inside the outer peripheral portion 12b of the first wafer 12, thereby continuously forming the modified layer 100 inside the outer peripheral portion 12b. The thermocompression bonding sheet 20 is then expanded to break the chamfered portion 12a, so that the chamfered portion 12a is removed from the first wafer 12. Accordingly, the chamfered portion 12a can be appropriately removed without causing a crack at an outer periphery of the first wafer 12.

Although the stacked wafer 10 includes two wafers (first wafer 12 and second wafer 14) laminated in the above-described embodiment, the present invention is not limited to this case and the stacked wafer 10 may include three or more wafers laminated.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A stacked wafer processing method for processing a stacked wafer having at least two wafers laminated together, the method comprising:

a sheet laying step of laying a thermocompression bonding sheet on an upper face of one wafer of the at least two wafers;

a thermocompression bonding step of thermocompression-bonding the thermocompression bonding sheet to an outer peripheral portion of the one wafer where a chamfered portion is formed;

a modified layer forming step of irradiating the stacked wafer with a laser beam having a transmission wavelength, the laser beam being applied to the thermocompression bonding sheet and the one wafer from the thermocompression bonding sheet side with a focal point of the laser beam positioned inside the outer peripheral portion of the one wafer, thereby continuously forming a modified layer inside the one wafer; and a chamfered portion removing step of expanding, after performing the modified layer forming step, the thermocompression bonding sheet to break the chamfered portion, thereby removing the chamfered portion from the one wafer.

2. The stacked wafer processing method according to claim 1, further comprising:

a grinding step of grinding, after performing the chamfered portion removing step, the upper face of the one wafer to a desired thickness.

3. The stacked wafer processing method according to claim 1, wherein the thermocompression bonding sheet includes a polyolefin sheet or a polyester sheet.

4. The stacked wafer processing method according to claim 3, wherein the polyolefin sheet includes a polyethylene sheet, a polypropylene sheet, or a polystyrene sheet, and the polyester sheet includes a polyethylene terephthalate sheet or a polyethylene naphthalate sheet.

5. The stacked wafer processing method according to claim 1, wherein the one wafer is made of silicon and the other wafer of the at least two wafers is made of a silicon substrate.

6. The stacked wafer processing method according to claim 1, wherein the thermocompression bonding sheet is larger in size than the stacked wafer.

7. The stacked wafer processing method according to claim 1, wherein the thermocompression bonding step includes pressing a heating rod on the thermocompression bonding sheet at the outer peripheral portion of the one wafer.

8. The stacked wafer processing method according to claim 1, wherein the modified layer forming step includes irradiating the stacked wafer with the laser beam so that the focal point of the laser beam is positioned inside the outer peripheral portion of the one wafer to continuously form the modified layer inside the one wafer and auxiliary modified layers that extend radially from the modified layer.

* * * * *